US009714961B2

(12) United States Patent
Berton et al.

(10) Patent No.: US 9,714,961 B2
(45) Date of Patent: Jul. 25, 2017

(54) CURRENT MEASURING DEVICE FOR ELECTRIC POWER LINES

(71) Applicant: SGE S.R.L., Grassobbio (BG) (IT)

(72) Inventors: Mario Berton, Este (IT); Andrea Pedron, Padova (IT)

(73) Assignee: SGE S.R.L., Grassobbio (BG) (IT)

(*) Notice: Subject to any disclaimer, the term of this patent is extended or adjusted under 35 U.S.C. 154(b) by 83 days.

(21) Appl. No.: 14/628,252

(22) Filed: Feb. 22, 2015

(65) Prior Publication Data

US 2015/0241483 A1 Aug. 27, 2015

(30) Foreign Application Priority Data

Feb. 24, 2014 (IT) .............................. PD2014A0042

(51) Int. Cl.
*G01R 19/00* (2006.01)
*G01R 15/18* (2006.01)

(52) U.S. Cl.
CPC ....... *G01R 19/0092* (2013.01); *G01R 15/181* (2013.01)

(58) Field of Classification Search
CPC .................................................. G01R 15/181
See application file for complete search history.

(56) References Cited

U.S. PATENT DOCUMENTS

| 3,626,291 | A | 12/1971 | Yauch et al. | |
|---|---|---|---|---|
| 5,414,400 | A | 5/1995 | Gris et al. | |
| 6,624,624 | B1* | 9/2003 | Karrer | G01R 15/181 324/117 R |
| 6,825,650 | B1 | 11/2004 | McCormack et al. | |
| 7,227,442 | B2* | 6/2007 | Skendzic | H01F 5/003 336/229 |
| 2003/0112000 | A1* | 6/2003 | Sorenson, Jr. | G01R 15/181 324/126 |
| 2006/0220774 | A1 | 10/2006 | Skendzic | |
| 2010/0207603 | A1 | 8/2010 | McNulty et al. | |
| 2013/0097609 | A1 | 4/2013 | Li et al. | |
| 2014/0015516 | A1* | 1/2014 | Sorensen | G01R 19/00 324/127 |

FOREIGN PATENT DOCUMENTS

EP 2051084 4/2009

* cited by examiner

*Primary Examiner* — Clayton E Laballe
*Assistant Examiner* — Noam Reisner
(74) *Attorney, Agent, or Firm* — King & Schickli, PLLC (57) ABSTRACT

Current measuring device (1) for electric power lines, which comprises an annular support body (3) made of insulating material provided with a through hole (4) for housing an electric cable (2), and a solenoid winding (8) provided with turns wound around the support body (3). The solenoid winding (8) is organized in multiple groups of turns (9), and such groups are positioned equally spaced apart from each other.

21 Claims, 7 Drawing Sheets

CURRENT MEASURING DEVICE FOR ELECTRIC POWER LINES

FIELD OF APPLICATION

The present invention regards a current measuring device for electric power lines, according to the preamble of the independent claim.

The present device is advantageously employable for supplying measurement values of the current that passes through low, medium or high-voltage electric power cables of the power transport lines, in particular in proximity to disconnecting switches, to transformers or even within stations or other network apparatuses.

More particularly, the device that is the subject of the present invention is advantageously employable for supplying current measurement values to devices for controlling the electric power distribution network.

STATE OF THE ART

As is known, in the field of distribution of medium and high voltage electric power, there is increasingly the need to acquire timely voltage and current data in order to allow an optimal management of the electric power line and in particular to allow an increasingly sufficient identification of the failure sections by means of remote-controlled systems.

For such purpose, devices are widely diffused that are arranged along the electric power lines in order to measure the voltage and current and supply measurement values adapted to allow monitoring the correct functioning of the electric power lines themselves and in particular to identify the possible different types of failure (e.g. short-circuits of one phase with the ground, short-circuits between phases, ground discharges, etc.).

More in detail, devices are known for measuring line current which are obtained with a Rogowski coil. The latter, as is known, comprises an annular support made from insulating material arranged around the electric cable being measured, and a solenoid winding provided with a plurality of turns successively wound around the annular support itself. The solenoid winding is extended like a ring around the electric cable along a closed curve C characterized by the insulating annular support.

As is known to the man skilled in the art, the operating principle of the Rogowski coil is based on the measurement of the flux of the magnetic field concatenated with the turns of the solenoid winding along the aforesaid closed curve C characterized by the annular support of the coil. As is known, such magnetic flux is proportional to the magnetic tension $\int \underline{H} \circ \underline{t} dl$ between the initial and final point of the winding (where $\underline{H}$ is the magnetic field, $\underline{t}$ is the versor tangent to the closed curve C). Since the magnetic voltage is detected along the closed curve C, it supplies the circulation of the magnetic field $\underline{H}$ along such closed curve C. According to Ampere's law, the circulation of the magnetic field $\underline{H}$ along the closed curve C is equal to the current concatenated with the closed curve C itself, i.e. to the current that passes through the electric cable around which the Rogowski coil is mounted.

On the basis of such considerations, the measurement of the current executed by the Rogowski coil is not in principle affected by the position where current traverses the closed curve C, along which the circulation of the magnetic field is calculated, and therefore the obtained measurement is not affected by problems of centering of the electric cable, through which the current flows. The measurement of the current is also not affected by currents outside the coil, i.e. those currents that are not concatenated with the closed curve C along which the circulation of the magnetic field is calculated.

In practice, the Rogowski coil supplies an approximation of the circulation along the closed curve C, by executing a summation of the function $\underline{H} \circ \underline{t}$ (i.e. of the component of the magnetic field tangent to the closed curve C) over a discrete set of points (corresponding to the single turns of the solenoid winding).

Consequently, due to such approximation, the measurement of the current carried out by the Rogowski coil on an electric cable is in practice affected in an undesired manner by external currents (which pass for example into the other electric cables of the line) and by the position of the electric cable around which the coil is mounted.

In order to reduce such drawbacks, it is important that the turns of the solenoid winding of the coil are wound in a very dense and uniform manner along the annular extension of the insulating support around the electric cable, in a manner such to approximate as best as possible the summation actually calculated to the circulation integral.

For such purpose, current measuring devices are known that are obtained by means of Rogowski coils obtained on a printed circuit, in which the solenoid winding is obtained by means of metal tracks of very small thickness that achieve a high number of turns distributed in a very dense manner.

For example, the U.S. Pat. No. 5,414,400 and EP 2051084 describe current measuring devices of known type, each of which obtained with a Rogowski coil that comprises two copper solenoid windings connected in series and obtained on a single multilayer printed circuit provided with a central hole, within which the electric cable is intended to be inserted.

In addition, the printed circuit is incorporated within a body made from insulating material adapted to ensure the insulation from the medium and high voltage electric power lines.

A drawback of this device of known type is due to the fact that it requires complex, long installation operations, since it is necessary to disconnect the electric cable from the line in order to insert it in the hole of the printed circuit of the device itself.

In order to resolve such drawback, current measuring devices have for some time been known on the market that are composed of a Rogowski coil that can open and reclose in order to allow the installation thereof around the electric cable, without having to disconnect the latter from the line.

More in detail, such openable Rogowski coil comprises a flexible support with elongated form, around which the turns of the solenoid winding are wound. Such flexible support is extended between two opposite ends thereof that can be joined together so as to allow closing the ring-like coil around the electric cable. In particular, the ends of the flexible support are provided with removable couple means, such as male-female connections, clamps, etc.

The latter current measuring devices of known type, provided with openable Rogowski coils, provide measurements that are not particularly precise due to the fact that, at the junction ends of the flexible support, there is an interruption of the turns of the solenoid winding. Such discontinuity does not allow calculating the magnetic tension on closed lines, but on open lines, and therefore does not allow obtaining a measurement proportional to the circulation of the magnetic field along the closed curve C characterized by the flexible support of the coil. Since, according to Ampere's law, the circulation of the magnetic field is equal to the current concatenated with the closed curve C, the impossibility of obtaining the correct measurement of such circulation causes the appearance of errors in the measurement of the current that is concatenated with the closed curve C (and which corresponds with the current that crosses through the electric cable around which the Rogowski coil is mounted).

In particular, the measurement of the current that crosses through the electric cable is affected by the presence of external currents (such as the currents of the other electric cables of the line) since the magnetic field generated by the latter contributes to the integral of the magnetic field along a non-closed curve.

In addition, the measurement of the current passing through the electric cable, around which the Rogowski coil is mounted, is not independent from the position of the cable itself and therefore is susceptible to undesired variations tied to the incorrect centering of the electric cable with respect to the coil itself.

In addition, the aforesaid current measuring devices of known type, obtained with Rogowski coils provided with flexible support, are not suitable for being incorporated in a body made from insulating material adapted to ensure the electrical insulation from the medium and high voltage lines.

There is the particular need, especially in the field of monitoring of medium and high voltage electric power lines, to obtain current measuring devices capable of supplying precise measurements of the current of the electric cable and which can be installed without having to disconnect the cable from the line.

The U.S. Pat. No. 3,626,291 describes a direct current measuring device, which comprises a support body formed by two semicircular shells hinged to each other, and movable in order to arrange the support body around an electric cable, and a solenoid winding arranged inside each semicircular shell. More in detail, each solenoid winding is provided with multiple groups of first turns, and multiple groups of second turns which have size smaller than the first turns and are arranged alternated with the latter along the extension of the winding itself.

The latter device of known type described in the U.S. Pat. No. 3,626,291 is unable to adequately resolve the problems tied to the poor precision of the detected measurements, due in particular to the interruptions of turns at the ends of the semicircular shells of the support body.

The patents US 2003/112000 and U.S. Pat. No. 6,825,650 describe current measuring devices of known type, each of which comprising a plate-like support body which is provided with a through hole intended to house an electric cable at its interior. In addition, the device comprises multiple single-layer printed circuits, each of which with a corresponding spiral winding obtained thereon and it is arranged on the support body at a specific angular position around the through hole of the support body itself.

More in detail, each printed circuit is arranged transverse to the support body and is fixed to the latter by means of an engagement tooth thereof, which is inserted within a corresponding engagement hole of the support body and is provided with an electric terminal in contact with a corresponding metal track of the support body, in a manner such to electrically connect together in series the windings obtained on the different printed circuits.

A first drawback of the measurement devices described in the patents US 2003/112000 and U.S. Pat. No. 6,825,650 is due to the fact that the arrangement of the windings on corresponding printed circuits, assembled to the support structure in specific angular positions, does not to allow obtaining high precision of the current measurements.

A further drawback is due to the fact that the process of assembly of the printed circuits, on which the windings are obtained, on the support body does not ensure an accurate, correct positioning of the direction of the plane of the printed circuit, involving a further factor of poor precision of the current measurements.

The patent US 2010/0207603 describes a current measuring device which comprises a support body shaped as a U in a manner so as to be arranged astride an electric cable, and multiple solenoid windings connected together in series and arranged along the opening delimited by the internal edge of the support body itself.

More in detail, each solenoid winding is positioned along a corresponding section of the internal edge of the support body and is extended transverse to such edge for a limited strip of the support body itself.

The device is also provided with a support pole fixed to the support body and intended to be gripped by an operator in order to arrange the device with the support body astride the electric cable whose current is to be measured.

Also the latter device of known type has shown in practice that it does not lack drawbacks.

In particular, the arrangement of the solenoid windings along the U-shaped extension of the support body requires the use of specific circuits for controlling the position and centering of the solenoid windings, with a consequent high cost of production of the current measuring device.

In addition, the device described in the patent US 2010/0207603 is not at all suitable for being permanently installed on a current line in order to continuously detect current measurements, given that it is only applicable to an electric cable in a temporary manner for executing occasional maintenance operations.

PRESENTATION OF THE INVENTION

The main object of the present invention is therefore to overcome the drawbacks manifested by the above-considered solutions of known type by providing a current measuring device for electric power lines capable of supply measurements with high precision, and in particular which is not affected by the disturbances due to magnetic fields generated by the external currents.

A further object of the present invention is to provide a current measuring device that is simple and quick to install.

A further object of the present invention is to provide a current measuring device for electric power lines which is structurally simple and inexpensive to make, and which is capable of reliably ensuring the insulation from the average and high voltage lines.

A further object of the present invention is to provide a current measuring device for electric power lines that is entirely reliable in operation.

BRIEF DESCRIPTION OF THE DRAWINGS

The technical characteristics of the invention, according to the aforesaid objects, are clearly seen in the contents of the below-reported claims and the advantages thereof will be clearer in the following detailed description, made with reference to the enclosed drawings which represent a merely exemplifying and non-limiting embodiment of the invention, in which:

DETAILED DESCRIPTION

With reference to the enclosed drawings, reference number 1 overall indicates the current measuring device for electric power lines, subject of the present invention.

In accordance with the embodiment illustrated in the enclosed figures, the current measuring device 1 is operatively associable with an electric cable 2 of a line for transporting electric power, e.g. low, medium or high voltage three-phase power, in order to measure the approximate value of the current that crosses through the electric cable 2 itself. In particular, the current measuring device 1 is particularly suitable for being used for measuring the current that crosses through the electric cables of medium-voltage lines, with line voltage comprised between about 5 kV and 36 kV.

The present current measuring device 1 comprises a support body 3 which is provided with a through hole 4 intended to house an electric cable 2 at its interior. More in detail, the support body 3 has substantially planar form and is provided with an external perimeter surface 6 (having preferably circular profile) and with an internal perimeter surface 5, which at least partially delimits the aforesaid through hole 4 which has an axis X substantially orthogonal to the plane of extension of the support body 3 itself.

Advantageously, the support body 3 is extended ring-like with substantially constant section around the through hole 4, according to a preferably circular extension having center on the axis X of the through hole 4.

In addition the support body 3 is preferably provided with a first flat face 3' and with a second flat face 3" directed in opposite directions with respect to each other and between which the through hole 4 is axially extended.

Advantageously, the support body 3 of the current measuring device 1 is made from insulating and preferably rigid material.

In addition, the current measuring device 1 comprises a solenoid winding 8 made of conductive material, arranged on the support body 3 and being extended around the through hole 4 along a direction of extension S that is substantially annular and preferably circular. According to the present invention, the solenoid winding 8 is organized in multiple groups of turns 9 wound on the support body 3. Such groups of turns 9 are separated from each other by spacing sectors 10 of the support body 3 arranged alternately with the groups of turns 9 along the direction of extension S of the solenoid winding 8.

The groups of turns 9 of the solenoid winding 8 are connected together in series through electrical connections 11 (lacking turns) that pass through the spacing sectors 10 of the support body 3.

In addition, the groups of turns 9 of the solenoid winding 8 are distributed along the direction of extension S of the solenoid winding 8 substantially equally spaced apart from each other.

The groups of turns 9 of the solenoid winding 8 are extended around the through hole 4 for corresponding first arcs of circumference of the direction of extension S having preferably the same length.

Advantageously, each spacing sector 10 of the support body 3, interposed between two groups of turns 9 of the solenoid winding 8, is extended for a specific second arc of circumference around the through hole 4, parallel to the line of extension S of the solenoid winding 8.

Preferably, in accordance with the embodiment illustrated in the enclosed figures, the spacing sectors 10 of the support body 3 are extended for the aforesaid second arcs of circumference having substantially the same length.

In particular, the first arcs of circumference of the groups of turns 9 have the same length as the second arcs of circumference of the spacing sectors 10.

Advantageously, the turns of each group of turns 9 are substantially extended for the entire width of the support body 3 between the internal perimeter surface 5 and the external perimeter surface 6 of the support body 3 itself, in order to optimize the concatenation of the magnetic field lines.

Figure 3:
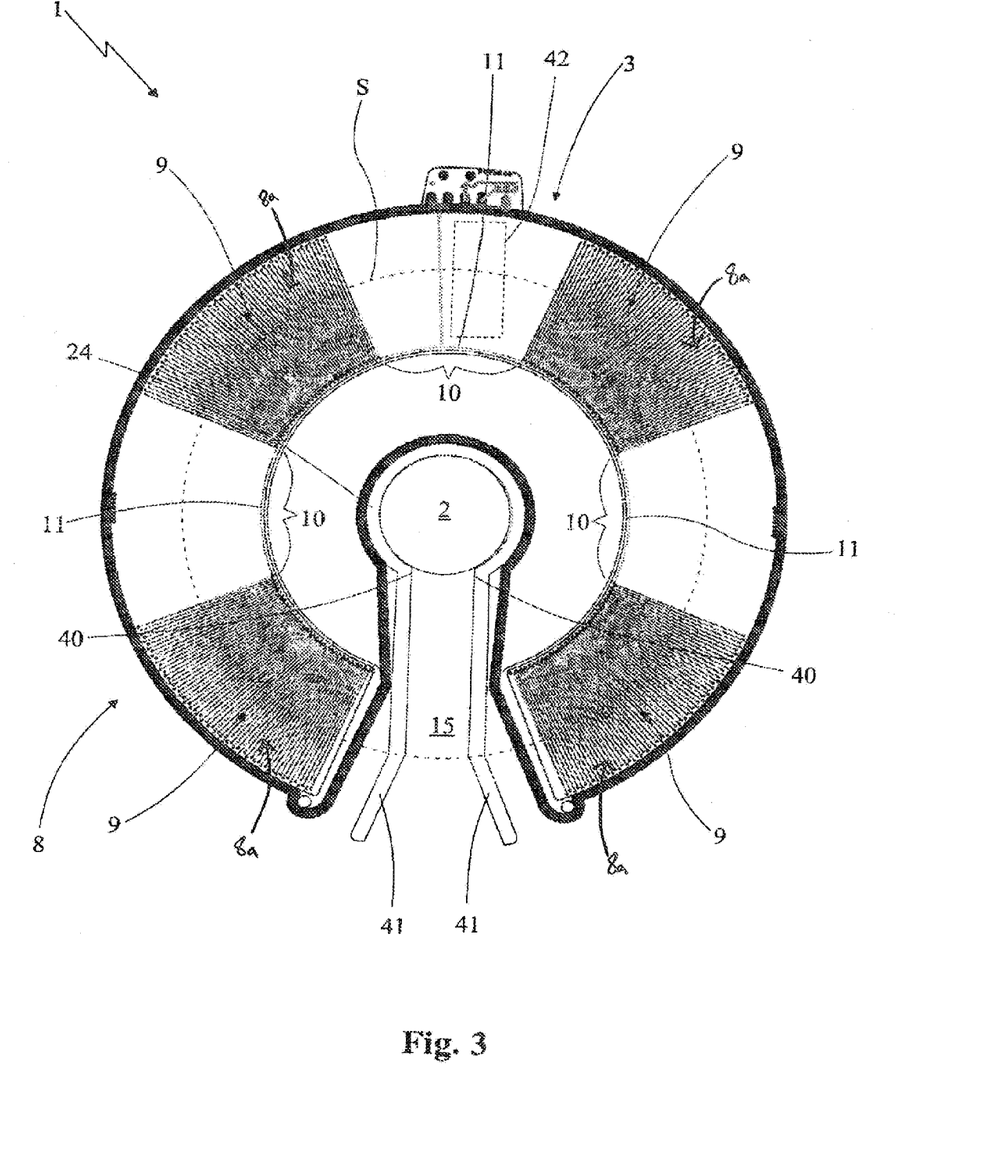
FIG. 3 shows a section view of the current measuring device illustrated in FIG. 2 with several parts removed in order to better illustrate other parts, in accordance with a first embodiment of the present invention.
Figure 5:
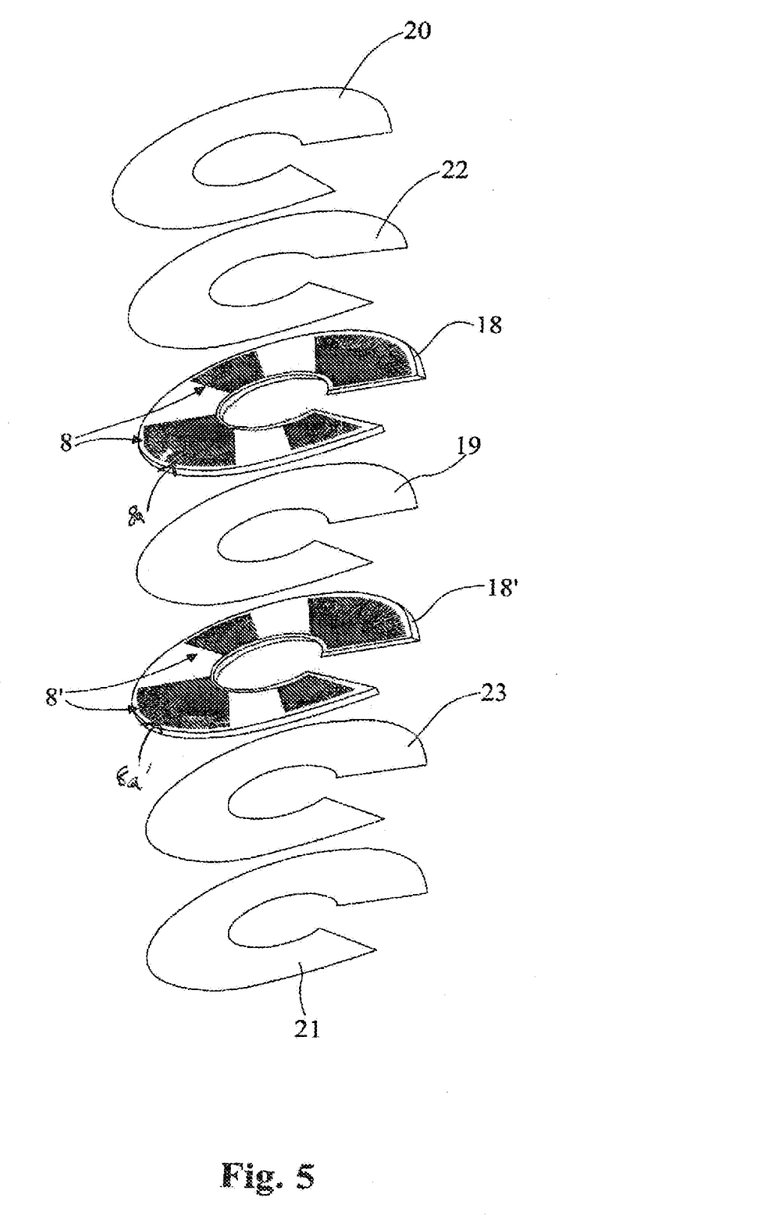
FIG. 5 shows an exploded schematic view of the current measuring device illustrated in FIG. 4.
Figure 6:
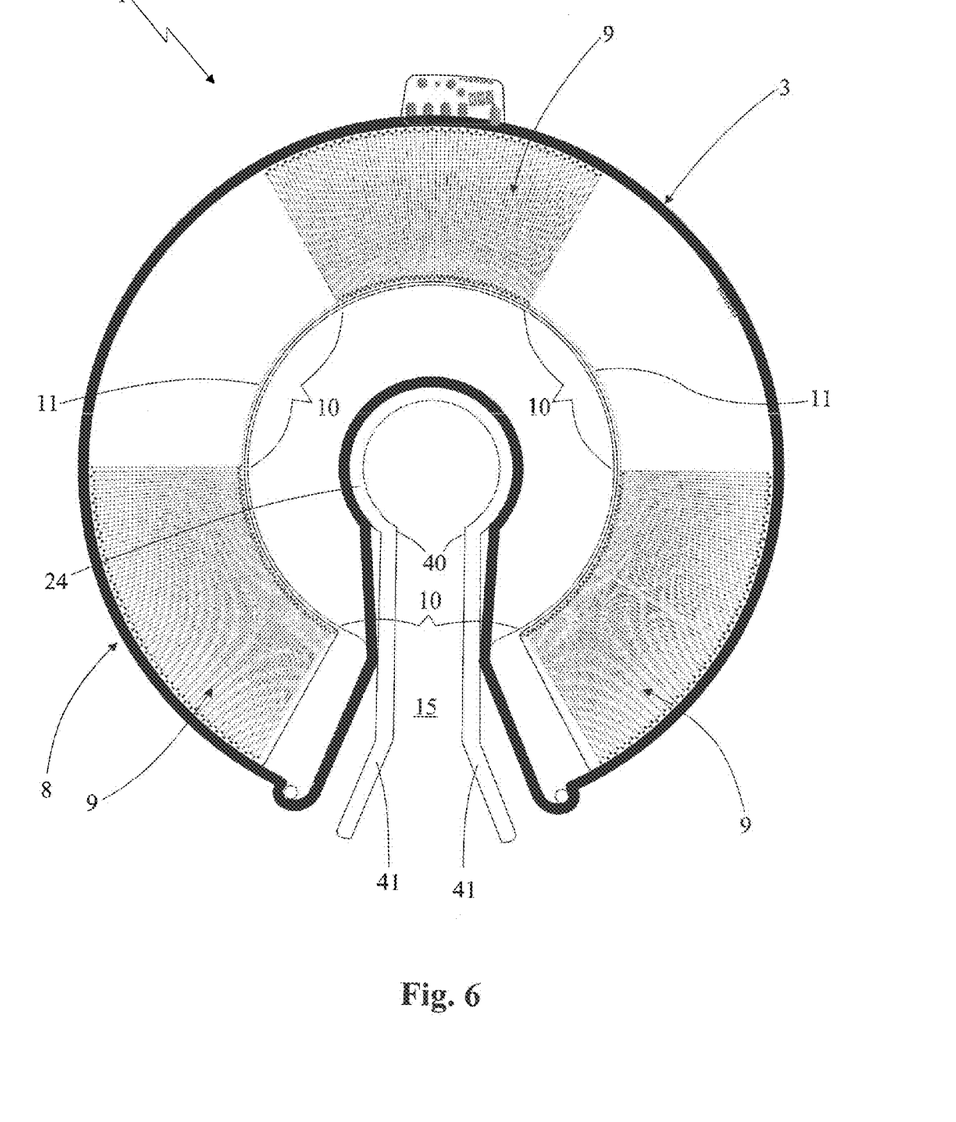
FIG. 6 shows the present current measuring device, in accordance with a second embodiment of the present invention.

There are preferably more than two groups of turns 9 of the solenoid winding 8; for example, the solenoid winding 8 comprises four groups of turns 9 (in accordance with the first embodiment illustrated in FIGS. 3-5) or three groups of turns 9 (in accordance with the embodiment illustrated in FIG. 6). Of course, without departing from the protective scope of the present invention, there can also be more than four groups of turns 9 of the solenoid winding 8, as a function in particular of the specific application situations where the device 1 is intended to be used.

The aforesaid distribution of the equidistant groups of turns 9 of the device 1, according to the invention, allows precisely measuring the current of the electric cable 2, even in the presence of interruptions of the turns of the solenoid winding 8, since such distribution of the groups of turns 9 ensures that the device 1 is substantially unaffected by the effects of the magnetic fields generated by external currents and by centering deviations of the electric cable 2, as explained in detail hereinbelow.

In accordance with the considerations reported in the discussion of the state of the art, a Rogowski coil of known type executes a summation of the component $\underline{H} \circ \underline{t}$ of the magnetic field $\underline{H}$ tangent to the closed curve C (characterized by the ring-like extension of the support body 3 around the through hole 4).

From an analysis of the progression of this component $\underline{H}\circ\underline{t}$ along the closed curve C, it was surprisingly found that the equidistant arrangement of the groups of turns 9 of the solenoid winding 8 allows obtaining measurements that are not significantly affected by the external currents and by the centering.

More in detail, indicating with γ(s) the parametric equation of the closed curve C expressed as a function of a specific parameter s (e.g. a curvilinear abscissa that measures the length of the curve starting from a pre-established point, or, in the case of flat curves, an angular coordinate θ using the polar coordinates that results γ(θ)=(x(θ), y(θ))=(ρ(θ)cos θ, ρ(θ)sin θ)), one can write $\underline{H}\circ\underline{t}=\underline{H}(\gamma(s))\circ\underline{\gamma}'(s)/|\gamma'(s)|$.

Initially, one considers the particular case of a uniform magnetic field $\underline{H}$ that hits a solenoid winding wound on a toroidal support body with average radius r. In such case, the turns of the winding are centered on the curve C, which is a circumference and which can be expressed with the parametric form γ(θ)=(x(θ), γ(θ))=(r cos θ, r sin θ).

Assuming the curve C placed on a Cartesian plane x,y with center at the origin of the plane, and assuming $\underline{H}$ oriented in the direction of the axis y, one obtains $\underline{H}\circ\underline{t}$=H cos θ, where H is the constant modulus of the magnetic field $\underline{H}$.

The integral of this sinusoidal function H cos θ over the interval −π<θ<π equals zero, and thus also equaling zero is the summation on a succession of points of this function that are equally spaced over any one wide interval 2π starting from any one initial angle.

Since such equally-spaced points correspond to the position of the turns of the solenoid winding along the circulation curve C, this implies that a solenoid winding with circular extension constituted by equally-spaced turns is not affected by a uniform magnetic field. Such consideration can be extended to a solenoid winding comprising groups of turns that are equally spaced.

It has also been found that in the case of magnetic fields $\underline{H}$ generated by rectilinear currents outside the closed line C (and hence outside the ring-like extension of the solenoid winding), the progression of the function $\underline{H}\circ\underline{t}$ is still roughly sinusoidal.

Figure 7:
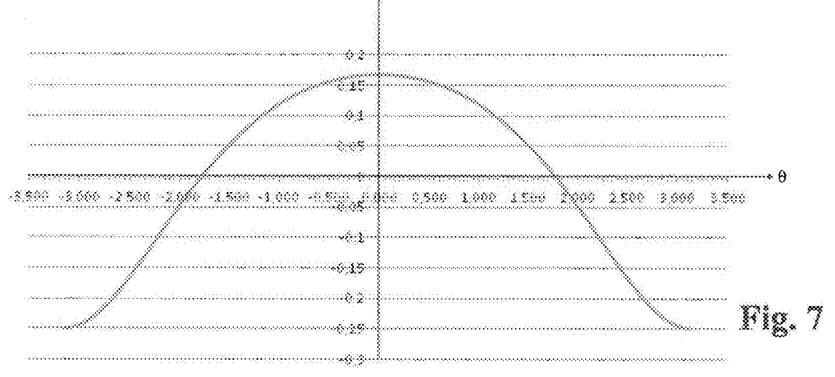
FIG. 7 shows a graph that represents an example of the progression of the function $\underline{H} \circ \underline{t}$ on a circular circulation curve, for a magnetic field $\underline{H}$ generated by a rectilinear current passing at a distance equal to five times the radius from the circulation curve and according to a direction perpendicular to the plane of such curve.

For example, reported in FIG. 7 is the progression of the function $\underline{H}\circ\underline{t}$ on a closed circular line C with radius r (corresponding to the average radius of the ring-like extension of the solenoid winding), at the various angles θ, for a magnetic field generated by a rectilinear current passing at a distance d=5r and perpendicular to the circular closed line C.

As can be observed, the function $\underline{H}\circ\underline{t}$ has zero average, indeed its integral over the interval −π<θ<π must cancel out since it corresponds to the circulation of a magnetic field $\underline{H}$ only generated by currents outside the closed curve C. In addition, such function $\underline{H}\circ\underline{t}$ maintains a rather gentle progression so as to still allow obtaining an approximately zero average even if calculated over a discrete set of equidistant points.

For example, if the distance of the external current from the center of the curve C is at least about five times the radius r of the curve C itself, the contribution of the measurement supplied by the device 1 due to the external current (which is an undesired current with regard to the measurement operation) with respect to the contribution due to the current passing through the center (and which corresponds to the current to be measured) is less than 0.01 for a solenoid winding composed of at least three equidistant groups of turns, and is less than 0.001 for a solenoid winding composed of at least four equidistant groups of turns.

Therefore, rectilinear currents outside the device 1, and spaced from the center of the ring-like extension of the winding 8 at least five times the average radius of the winding 8 itself, do not alter the measurement, and generally the circulation, obtained via approximation as the sum over a discrete number of regularly arranged points, approximates the correct value obtained via integration quite well.

Therefore, in such conditions the current measuring device 1, subject of the present invention, is substantially unaffected by the magnetic fields generated by external currents. It was also found that in case of deviations of the current to be measured from the center of the circular line C (corresponding to deviations of the electric cable 2 from the center of the ring-like extension of the winding 8), the present device 1 is capable of providing current measurements without significant errors.

This is demonstrated, for example, by comparing the conduct of the measurement of a rectilinear current within the circular line C at a specific distance from the center, with the conduct of the measurement of a rectilinear current of equal intensity passing through the center of the line C. Indeed, from such comparison it was found that, for distances of the current from the center of the line C less than ⅕ of the radius of the line C, the relative difference of the current measurement, with respect to the measurement of the current passing through the center, is less than 0.01 for windings 8 composed of at least three equidistant groups of turns, and is less than 0.001 for windings 8 composed of at least four equidistant groups of turns.

It was also found that all the functions of type $\underline{H}\circ\underline{t}=\underline{H}(\gamma(s))\circ\underline{\gamma}'(s)/|\gamma'(s)|$, treated in this analysis, have a periodicity in the variable s (in the sense that at the final point of the integration interval, such functions exactly follow the same values of the initial point), given that they come from a closed line C of which γ(s) is the parametric equation, and are therefore susceptible to be developed in Fourier series.

In this manner, the function $\underline{H}\circ\underline{t}$ can be expressed as a series of sinusoidal terms, for each of which it is found that the sum executed on a number of equidistant points is canceled, save for the sinusoids that have a frequency whose ratio with respect to the fundamental frequency is exactly divisible by the number of points over which the average is calculated. If follows that with the increase of the number of points, there are always less harmonics averaged over these points that give a value different from zero and which therefore contribute to moving the averaged value over a set of equidistant points from the averaged value over the entire period.

For example, for a device 1 with solenoid winding 8 provided with four equally-spaced groups of turns, the first three terms of the Fourier series do not give any error contribution and only the terms with frequency 4, 8, 12, 16, . . . times the fundamental frequency contribute to the error.

Hence, even if the field is not uniform but varies slowly enough, the spatial harmonics of high order are quickly attenuated and their contribution is minimal.

Such conditions are found in the application conditions, in particular in medium-voltage lines, in which the device 1 that is the subject of the present invention is intended to be applied, which is therefore unaffected by the external currents and by the centering deviations of the electric cable 2.

In addition, the arrangement of the turns of each group of turns 9 according to the invention, distributed along first arcs of circumference of the direction of extension S of the support body 3, allows obtaining greater accuracy in the detected current measurements, in particular with respect to the devices of known type which have the turns concentrated in localized angular positions.

More in detail, an analysis of the present current measuring device 1, having equivalent first arcs of circumference of the groups of turns 9 and equivalent second arcs of circumference of the spacing sectors 10, demonstrates that independent of the number of groups of turns 9, the precision, both in terms of error due to the non-centering of the measurement current (with respect to the center of the ring-like extension of the winding 8), and in terms of sensitivity to external currents not subject to measurement, improves with the increase of the space occupied by the turns along the direction of extension S of the support body 3.

Figure 8:
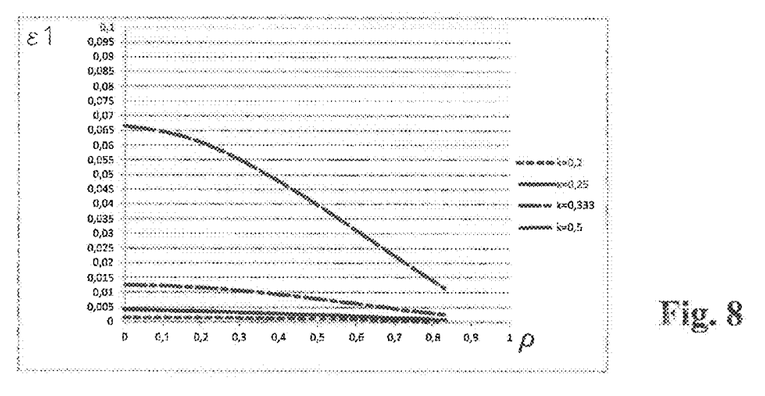
FIG. 8 shows a graph that represents an example of the progression of the measurement error due to the non-centering of the current to be measured, as a function of the fill factor of the groups of turns of the solenoid winding.

For example, the graph reported in FIG. 8 illustrates the progression of a first measurement error $\epsilon 1$ due to the non-centering of the measurement current, and calculated for the present device 1 provided with four groups of turns 9 (alternated with four spacing sectors 10). Such first measurement error $\epsilon 1$ is set for different values of the non-centering parameter k1 (defined as the distance of the measurement current from the center of the ring-like extension of the solenoid winding 8 divided by the average radius of the ring-like extension of the winding 8), as a function of the fill factor (i.e. of the angular fraction occupied by the groups of turns 9 of the solenoid winding 8 along the direction of extension S of the support body 3). More in detail, the first measurement error $\epsilon 1$ is defined as the value of the difference between the detected measurement of the non-centered current and the expected measurement (which would be detected in the case of measurement current passing through the exact center of the ring-like extension of the solenoid winding 8), normalized with respect to the expected measurement.

More in detail, the condition with fill factor $\rho=0$ corresponds to a first limit case of a device (different from the present device) provided with groups of turns that are all concentrated in four pre-established angular positions at 90°.

The condition with the fill factor $\rho=0.5$ corresponds to the case of the present device 1 provided with a distribution of the groups of turns 9 on four first arcs of circumference with angle at the center of 45° alternated with four spacing sectors 10 (lacking turns) being extended for corresponding second arcs of circumference with angle at the center of 45°. The condition with the fill factor $\rho=1$ corresponds to a second limit (in which the error would tend towards 0) of a device (not the subject of the present invention) having a uniform distribution of turns along the entire direction of extension of the support body (i.e. with spacing sectors of zero length).

Figure 9:
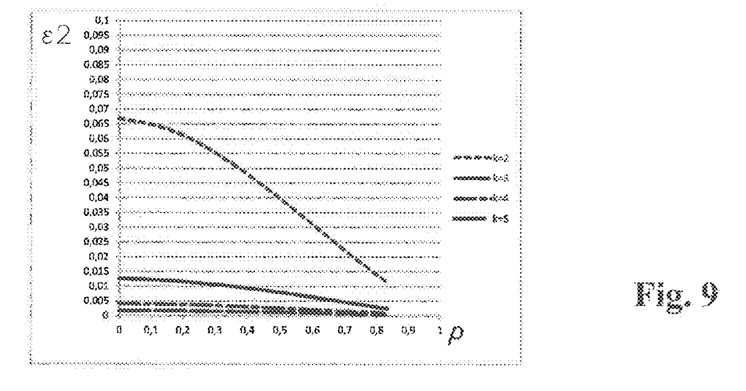
FIG. 9 shows a graph that represents an example of the progression of the measurement error due to external currents, as a function of the fill factor of the groups of turns of the solenoid winding.

The graph reported in FIG. 9 illustrates the progression of a second measurement error $\epsilon 2$ due to external currents not subject to measurement, and calculated for the device 1 provided with four groups of turns and set for different values of the deviation parameter k2 of a current outside the solenoid winding 8 and not subject to measurement, as a function of the fill factor $\rho$. The aforesaid deviation parameter k2 is defined as the distance of the current from the center of the ring-like extension of the solenoid winding 8 divided by the average radius of the solenoid winding 8; the aforesaid fill factor $\rho$ is defined as the angular fraction occupied by the groups of turns 9 of the solenoid winding 8 along the direction of extension S of the support body 3.

More in detail, the second measurement error $\epsilon 2$ is defined as the value of the difference between the detected measurement of the external current and the expected measurement (which would be detected in the case of measurement current passing through the exact center of the ring-like extension of the solenoid winding 8), normalized with respect to the expected measurement.

The aforesaid graphs clearly show that the errors $\epsilon 1$ and $\epsilon 2$ are considerably reduced with the increase of the fill factor $\rho$, i.e. with the increase of the length of the first arcs of circumference of the groups of turns 9 of the solenoid winding 8 along the direction of extension S of the support body 3.

Advantageously, the support body 3 of the device 1 is provided with a side opening 15 which is formed passing through one of the spacing sectors 10 of the support body 3 itself. Such side opening 15 communicates with the through hole 4 in order to allow the insertion therein of the electric cable 2 during the operations of installation of the device 1, without having to disconnect the electric cable 2 itself from the electric power line.

The arrangement of the solenoid windings 8 equidistant from each other, according to the present invention, allows obtaining the aforesaid side opening 15 in the spacing sector 10 of the support body 3 without the interruption of the turns of the solenoid winding 8 causing a significant sensitivity of the device 1 to the currents outside the winding 8 and to the centering of the electric cable 2 with respect to the device 1, in accordance with that stated above.

In particular, the side opening 15 is extended such that it passes between the two flat faces 3', 3" of the support body 3, and is also extended such that is passes between the internal perimeter surface 5 and the external perimeter surface 6 of the support body 3 itself.

Preferably, the side opening 15 is extended, between the aforesaid internal and external surface perimeters 5 and 6, according to an extension substantially orthogonal to the axis of the through hole 4.

Advantageously, the side opening 15 is extended according to the direction of extension S of the support body 3 with a length smaller than or equal to the first arc of circumference of each group of turns 9, in a manner such to allow the regular distribution of the groups of turns 9 around the through hole 4 of the support body 3.

Figure 4:
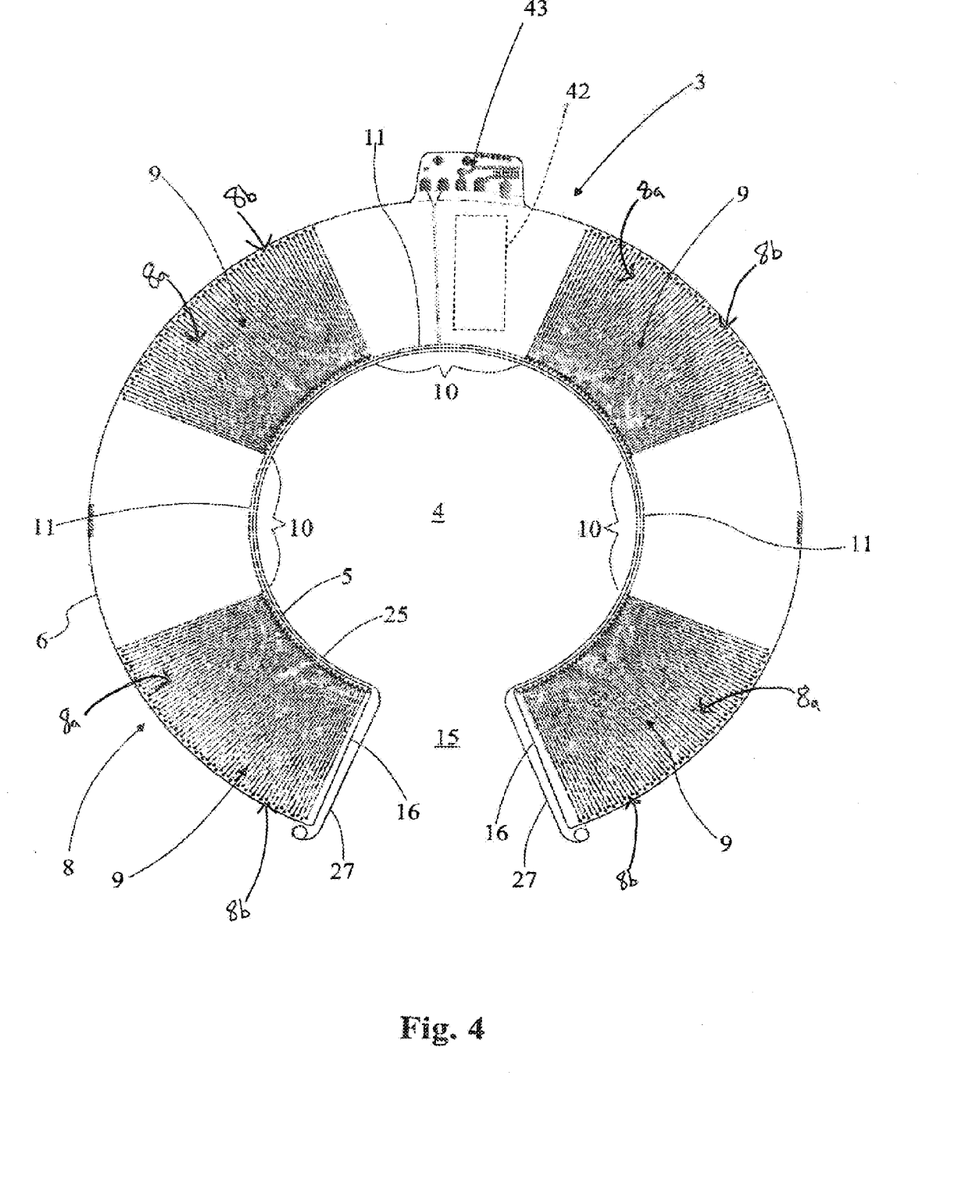
FIG. 4 shows a view of the current measuring device illustrated in FIG. 3 with further parts removed in order to better illustrate the support body and the solenoid winding of the device itself.

In accordance with the embodiment illustrated in FIG. 4, the support body 3 of the current measuring device 1 is extended, around the through hole 4, between two end faces 16 thereof separated from each other by the aforesaid side opening 15.

According to the present invention, the support body 3 and the solenoid winding 8 of the current measuring device 1 are obtained by means of a printed circuit, preferably multilayer.

In particular, the support body 3 comprises a first flat support 18 made of insulating material, preferably vetronite, on which the solenoid winding 8 is obtained.

More in detail, the solenoid winding 8 is formed by tracks 8a provided on both faces of the first flat support 18, and by metalized holes 8b obtained between the tracks of the two faces. Preferably, the tracks that form the turns of the solenoid winding 8 are substantially extended in a radial manner with respect to the axis X of the through hole 4.

Advantageously, in accordance with the embodiment illustrated in FIG. 5, the current measuring device 1 comprises a further solenoid winding 8' arranged on the support body 3, positioned parallel to and side-by-side the solenoid winding 8 and electrically connected in series to the latter.

Preferably, the further solenoid winding 8' is organized in groups of turns that are equidistant from each other, and has the same characteristics as the above-described solenoid winding 8.

The aforesaid further solenoid winding 8' allows considerably reducing the onset of disturbances in the measurement due to magnetic fields concatenated with the ring defined by the direction of extension of the windings 8, 8', as explained in detail hereinbelow.

The solenoid winding 8 forms a parasitic turn along the curve characterized by the annular extension of the support body 3, substantially due to the helical advancement of the turns of the winding 8 along the support body 3. This parasitic turn is susceptible of collecting a magnetic field generated by a current outside the solenoid winding 8, and which is concatenated with such parasitic turn. For example, if the support body 3 is characterized by a flat curve, the parasitic turn associated with this curve concatenates the flux of any current situated on the same.

The two aforesaid identical windings 8, 8', parallel to and side-by-side each other, are connected in a manner such that the winding helix of the turns of one winding advances on the same path but in opposite sense with respect to the other winding. In this manner, the flux concatenated with the two parasitic turn is opposite and cancels out.

Preferably, in accordance with the embodiment illustrated in the enclosed figures, the support body 3 comprises a second flat support 18' made from insulating material, parallel to the first flat support 18, on which the further solenoid winding 8' is obtained. The latter is advantageously obtained with corresponding metal tracks 8a' of the same type as those of the solenoid winding 8 described above.

Advantageously, the first and the second flat support 18, 18' of the printed circuit of the support body 3, are assembled together as a sandwich, with a first layer made from insulating material 19, preferably prepreg, interposed.

Such first layer made from insulating material 19 is traversed by electrical connections that connect together in series the two solenoid windings 8, 8'.

Advantageously, the current measuring device 1 comprises a first and a second metal shield 20, 21 respectively arranged to coat and first and the second flat face 3', 3" of the support body 3, and preferably respectively arranged on the first and on the second flat support 18, 18'.

The two metal shields 20, 21 are connected together by means of metal coatings (not illustrated) deposited on the perimeter surfaces 5, 6 of the support body 3, preferably by means of a metallization process, in a manner so as to obtain a complete covering of the support body 3.

The aforesaid metal shields 20, 21 and coatings allow obtaining a strong attenuation of the capacitive coupling caused by the presence of the electric fields of strong intensity (which would affect the functioning of the electric and electronic components of the current measuring device 1), allowing the attainment of particularly high levels of precision in the current measurement, even in the presence of particularly high intensity disturbances.

Advantageously, the device 1 comprises a second and a third layer made from insulating material 22, 23 respectively interposed between the first flat support 18 and the first metal shield 20, and between the second flat support 18' and the second metal shield 21, in order to prevent the electrical contact respectively between the first metal shield 20 and the solenoid winding 8 (obtained on the first flat support 18), and between the second metal shield 21 and the further solenoid winding 8' (obtained on the second flat support 18').

Figure 1:
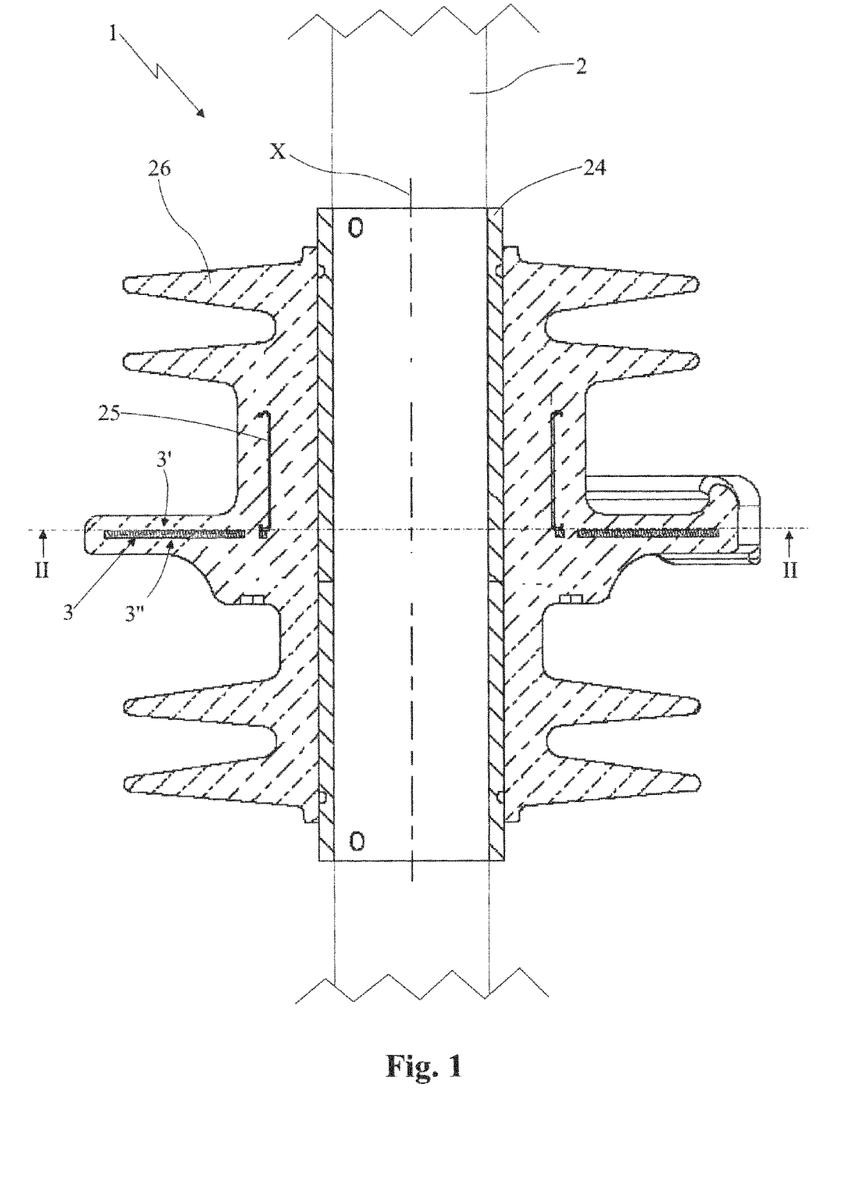
FIG. 1 shows a section view of the current measuring device that is the subject of the present invention, along a plan passing through the central axis of the device itself.
Figure 2:
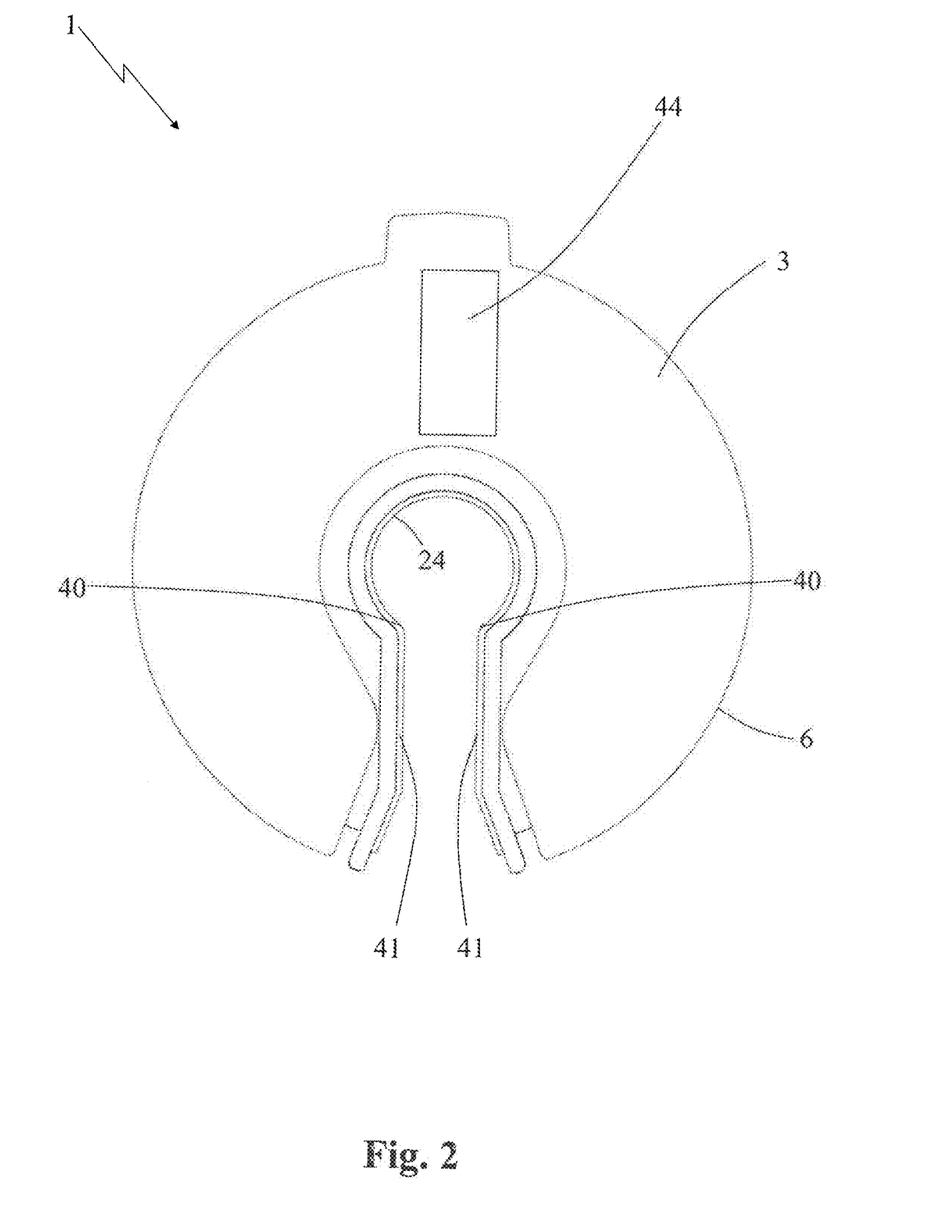
FIG. 2 shows a section view of the current measuring device illustrated in FIG. 1 along line II-II of the FIG. 1 itself.

Advantageously, in accordance with the embodiment illustrated in FIG. 1, the current measuring device 1 comprises a metal tubular support 24 arranged in the through hole 4 of the support body 3, adapted to receive the electric cable 2, and preferably positioned orthogonal to the plane of the support body 3.

In addition, the device 1 comprises a body made of isolating resin 26 in which the tubular support 24 and the support body 3 are incorporated. The body made of isolating resin 26 and the tubular support 24 are respectively provided with a first through slit and with a second through slit that are aligned and communicating with the side opening 15 of the support body 3 in order to allow, during the installation operations, the insertion of the electric cable 2 within the tubular support 24 itself.

Since the current measuring device 1 is intended to be operatively applied in particular to medium-voltage electric power lines, a nearly radial electric field of high intensity is susceptible of being generated between the tubular support 24 and the internal perimeter surface 5 of the support body 3.

Advantageously, the device 1 comprises an electrostatic shield 25 placed along the internal perimeter surface 5 of the support body 3, preferably obtained in the form of a metal net, in order to prevent the aforesaid electric field from closing on the support body 3. The latter is provided on its surface with sharp-edged metal parts, in particular at the edges of the perimeter surfaces 5, 6 and the end faces 16. Therefore, in the absence of the aforesaid electrostatic shield 25, intense electric fields would be susceptible of concentrating on the edges of the support body 3 (due to the point effect), and such fields could cause strong electrical discharges.

Advantageously, the electrostatic shield 25 is shaped with suitable bends that prevent the formation of intense electric fields on the edges of the support body 3.

Preferably, the electrostatic shield 25 is provided with two terminal portions 27 arranged on the corresponding end faces 16 of the support body 3 and provided with rounded bends. Such terminal portions 27 of the electrostatic shield 25 prevent the formation of intense electric fields on the edges of the support body 3 positioned at the side opening 15, in a manner so as to prevent the development of strong electrical discharges at the opening 15 itself.

Advantageously, in accordance with the embodiments illustrated in the enclosed figures, the metal tubular body 24 is provided with two longitudinal edges 40 which delimit between them the aforesaid first through slit of the metal tubular body 24 itself. The latter is also provided with two extension portions 41 which are arranged facing each other, are extended at least partially into the side opening 15 of the support body 3 and are positioned between the end faces 16 of the support body 3 itself. More in detail, each extension portion 41 is extended from the corresponding longitudinal edge 40 of the tubular body 24 up to at least the external perimeter surface 6 of the support body 3.

The aforesaid extension portions 41 of the metal tubular body 24 allow controlling the electric field that is formed at the electric cable 2, accompanying the force lines outside the side opening 15 in order to prevent the electric field from closing on the support body 3, avoiding the development of strong electrical discharges at the edges of the support body 3 itself (in particular arranged at the end faces 16 thereof).

Advantageously, the current measuring device 1 comprises a closing body made from insulating material (not illustrated), removably fixed to the support body 3 and inserted in the side opening 15 to close the latter, in order to further limit the onset of electrical discharges between the end faces 16 of the support body 3.

Advantageously, the current measuring device 1 comprises an electronic circuit 42 for the amplification and conditioning of the signal (schematically illustrated in the example of FIG. 4) which is obtained on one of the flat faces 3', 3" of the support body 3 at one of the spacing sectors 10 and is electrically connected to the solenoid winding 8 in order to receive electrical signals from the latter corresponding to the values of the measurements of the current passing through the electric cable 2.

Such electronic circuit 42 is adapted to receive the electrical signals coming from the solenoid winding 8 in order to supply, at the output, respective measurement signals at electrical terminals 43 arranged on the support body 3 of the current measuring device 1. In particular, such measurement signals supplied by the electronic circuit 42 are adapted to be used by devices for transmitting and processing the signal which are connected to the current measuring device 1.

In particular, the electronic circuit 42 is obtained with the same printed circuit with which the support body 3 and the solenoid winding 8 are obtained.

More in detail, the electronic circuit 42 is arranged on the first flat support 18 of the support body 3 (at the first face 3' thereof) and is connected to the terminals of the solenoid winding 8 by means of corresponding metal tracks 8a obtained on the first support body 18 itself.

The arrangement of the electronic circuit 42 at one of the spacing sectors 10 allows avoiding the use of connection cables outside the support body 3 in order to receive the electric signals from the solenoid winding 8, with a consequent reduction of disturbances on the signals themselves and thus ensuring an improved measurement reliability.

Advantageously, the first metal shield 20 of the current measuring device 1 is provided with an opening obtained above the electronic circuit 42, such opening preferably closed by means of a box 44 made of metal material, in particular aluminum, fixed above the first metal shield 20 in order to ensure the integrity thereof.

The invention thus described therefore attains the pre-established objects.

The invention claimed is:

1. Current measuring device (1) for electric power lines, which comprises:
    at least one support body (3), having substantially planar form and provided with an external perimeter surface (6) and with an internal perimeter surface (5), which at least partially delimits a through hole (4) having an axis (X) substantially orthogonal to said support body (3) and intended to house at least one electric cable (2) at its interior;
    at least one solenoid winding (8) made of conductive material, arranged on said support body (3) and being extended around said through hole (4) along a direction of extension (S) that is substantially annular and symmetric with respect to the axis (X) of said through hole (4);
    said support body (3) and said solenoid winding (8) being obtained by means of a printed circuit;
    said support body (3) being provided with at least one side opening (15) which is formed passing through one of said spacing sectors (10) and communicates with said through hole (4); said support body (3) being extended along said direction of extension (S) between two end faces (16) thereof separated from each other by said side opening (15);
    said through hole (4) being provided with a metal tubular support (24) arranged in the through hole (4) of said support body (3), the metal tubular support (24) adapted to receive said electric cable (2) at its interior and provided with a first through slit aligned and communicating with the side opening (15) of said support body (3);
    said solenoid winding (8) being organized in multiple groups of turns (9) which:
        are extended around said through hole (4) for corresponding first arcs of circumference of said direction of extension (S);
        are separated from each other by spacing sectors (10) of said support body (3) arranged alternately with said groups of turns (9) along the direction of extension (S) of said solenoid winding (8);
        are connected together in series through electrical connections (11) that pass through said spacing sectors (10); and
        are positioned substantially equally spaced apart from each other along the direction of extension (S) of said solenoid winding (8).

2. Current measuring device (1) for electric power lines according to claim 1, characterized in that said side opening (15) is extended according to said direction of extension (S) with a length smaller than or equal to the first arc of circumference of each said group of turns (9).

3. Current measuring device (1) for electric power lines according to claim 1, characterized in that said support body (3) is provided with a first flat face (3') and with a second flat face (3") directed in opposite directions with respect to each other and between which said through hole (4) is axially extended; said current measuring device (1) comprising at least one first metal shield (20) arranged on said first flat face (3') of said support body (3), and at least one second metal shield (21) arranged on said second flat face (3") of said support body (3), such first and second metal shields (20, 21) being connected together by means of peripheral metal coatings deposited on the perimeter faces (5, 6) and on the end faces (16) of said support body (3).

4. Current measuring device (1) for electric power lines according to claim 1, characterized in that the groups of turns (9) of said solenoid winding (8) are extended for corresponding said first arcs of circumference having substantially the same length.

5. Current measuring device (1) for electric power lines according to claim 4, characterized in that each said first arc of circumference has the same length as each said second arc of circumference.

6. Current measuring device (1) for electric power lines according to claim 1, characterized in that the spacing sectors (10) of said support body (3) are extended around said through hole (4) for corresponding second arcs of circumference having substantially the same length.

7. Current measuring device (1) for electric power lines according to claim 6, characterized in that each said first arc of circumference has the same length as each said second arc of circumference.

8. Current measuring device (1) for electric power lines according to claim 1, characterized in that the turns of each said group of turns (9) are substantially extended for the entire width of said support body (3) between said internal perimeter surface (5) and said external perimeter surface (6).

9. Current measuring device (1) for electric power lines according to claim 1, characterized in that it comprises a further solenoid winding (8') arranged on said support body (3), positioned parallel to and side-by-side said solenoid winding (8) and electrically connected in series to the latter.

10. Current measuring device (1) for electric power lines according to claim 1, characterized in that said support body (3) comprises a second flat support (18') made from insulating material, parallel to the first flat support (18), on which the further solenoid winding (8') is obtained; wherein said further solenoid winding (8') is obtained with corresponding metal tracks (8'a) of the same type as those of the solenoid winding (8).

11. Current measuring device (1) for electric power lines according to claim 1, characterized in that said metal tubular support (24) is provided with two longitudinal edges (40) which delimit said first through slit between them, and with two extension portions (41) facing each other and at least partially extended in said side opening (15) between the end faces (16) of said support body (3), each of such extension portions (41) extended from the corresponding said longitudinal edge (40) at least up to the external perimeter surface (6) of said support body (3).

12. Current measuring device (1) for electric power lines according to claim 1, comprising a body made of isolating resin (26) in which said metal tubular support (24) and said support body (3) are incorporated, such said body made of isolating resin (26) provided with a second through slit aligned and communicating with the side opening (15) of the support body (3) and with the first through slit of said metal tubular support (24).

13. Current measuring device (1) for electric power lines, which comprises:
- at least one support body (3), having substantially planar form and provided with an external perimeter surface (6) and with an internal perimeter surface (5), which at least partially delimits a through hole (4) having an axis (X) substantially orthogonal to said support body (3) and intended to house at least one electric cable (2) at its interior;
- at least one solenoid winding (8) made of conductive material, arranged on said support body (3) and being extended around said through hole (4) along a direction of extension (S) that is substantially annular and symmetric with respect to the axis (X) of said through hole (4);
- said support body (3) and said solenoid winding (8) being obtained by means of a printed circuit;
- said support body being provided with a first flat face (3') and with a second flat face (3") directed in opposite directions with respect to each other and between which said through hole (4) is axially extended;
- said current measuring device (1) comprising at least one electronic circuit (42) for the amplification and conditioning of the signal, electrically connected to said solenoid (8) and obtained on one of said flat faces (3', 3") of said support body (3) at one of said spacing sectors (10);
- said solenoid winding (8) being organized in multiple groups of turns (9) which:
  - are extended around said through hole (4) for corresponding first arcs of circumference of said direction of extension (S);
  - are separated from each other by spacing sectors (10) of said support body (3) arranged alternately with said groups of turns (9) along the direction of extension (S) of said solenoid winding (8);
  - are connected together in series through electrical connections (11) that pass through said spacing sectors (10); and
  - are positioned substantially equally spaced apart from each other along the direction of extension (S) of said solenoid winding (8).

14. Current measuring device (1) for electric power lines according to claim 13, characterized in that a side opening (15) of said support body (3) is extended according to said direction of extension (S) with a length smaller than or equal to the first arc of circumference of each said group of turns (9).

15. Current measuring device (1) for electric power lines according to claim 13, comprising at least one first metal shield (20) arranged on said first flat face (3') of said support body (3), and at least one second metal shield (21) arranged on said second flat face (3") of said support body (3), such first and second metal shields (20, 21) being connected together by means of peripheral metal coatings deposited on the perimeter faces (5, 6) and on the end faces (16) of said support body (3).

16. Current measuring device (1) for electric power lines according to claim 13, characterized in that the groups of turns (9) of said solenoid winding (8) are extended for corresponding said first arcs of circumference having substantially the same length.

17. Current measuring device (1) for electric power lines according to claim 13, characterized in that the spacing sectors (10) of said support body (3) are extended around said through hole (4) for corresponding second arcs of circumference having substantially the same length.

18. Current measuring device (1) for electric power lines according to claim 17, characterized in that each said first arc of circumference has the same length as each said second arc of circumference.

19. Current measuring device (1) for electric power lines according to claim 13, characterized in that the turns of each said group of turns (9) are substantially extended for the entire width of said support body (3) between said internal perimeter surface (5) and said external perimeter surface (6).

20. Current measuring device (1) for electric power lines according to claim 13, comprising a further solenoid winding (8') arranged on said support body (3), positioned parallel to and side-by-side said solenoid winding (8) and electrically connected in series to the latter.

21. Current measuring device (1) for electric power lines according to claim 13, characterized in that said support body (3) comprises a second flat support (18') made from insulating material, parallel to the first flat support (18), on which the further solenoid winding (8') is obtained; wherein said further solenoid winding (8') is obtained with corresponding metal tracks (8'a) of the same type as those of the solenoid winding (8).

* * * * *